United States Patent
Sehmbey et al.

(10) Patent No.: US 12,001,253 B2
(45) Date of Patent: Jun. 4, 2024

(54) WEARABLE ELECTRONIC DEVICE WITH THERMAL ENERGY TRANSFER SYSTEM AND CORRESPONDING METHODS

(71) Applicant: Motorola Mobility LLC, Chicago, IL (US)

(72) Inventors: Maninder S Sehmbey, Hoffman Estates, IL (US); Alberto R Cavallaro, Northbrook, IL (US); Ngee J Lee, Park Ridge, IL (US)

(73) Assignee: Motorola Mobility LLC, Chicago, IL (US)

( * ) Notice: Subject to any disclaimer, the term of this patent is extended or adjusted under 35 U.S.C. 154(b) by 79 days.

(21) Appl. No.: 17/835,585

(22) Filed: Jun. 8, 2022

(65) Prior Publication Data
US 2023/0400897 A1    Dec. 14, 2023

(51) Int. Cl.
*G06F 1/20* (2006.01)
*G06F 1/16* (2006.01)
*H05K 7/20* (2006.01)

(52) U.S. Cl.
CPC .............. *G06F 1/203* (2013.01); *G06F 1/163* (2013.01); *G06F 1/1688* (2013.01); *H05K 7/20981* (2013.01); *G06F 1/206* (2013.01)

(58) Field of Classification Search
CPC ............... G06F 1/163; G06F 2200/203; G06F 2200/201; G06F 1/1683; G06F 1/206; G06F 1/20; G06F 3/011; G06F 1/16; G06F 1/203; G06F 1/1688; H05K 7/2039; H05K 7/20336; H05K 7/20963; H05K 1/0203; H05K 1/028; H05K 1/0393; H05K 7/20509; H05K 7/20981; G02B 27/017; G02B 27/0172; F28D 15/0241; F28D 15/0275; F28D 2021/0028
See application file for complete search history.

(56) References Cited

U.S. PATENT DOCUMENTS

| | | | | |
|---|---|---|---|---|
| 5,646,822 A | * | 7/1997 | Bhatia | F28D 15/02 361/679.52 |
| 5,970,718 A | * | 10/1999 | Arnold | A61F 7/10 62/3.5 |
| 6,507,490 B2 | | 1/2003 | Sasaki et al. | |
| 7,746,631 B2 | | 6/2010 | Ali | |
| 9,639,120 B2 | | 5/2017 | Wu | |
| 9,740,023 B1 | * | 8/2017 | Ashwood | G06F 1/163 |
| 10,182,937 B2 | * | 1/2019 | Smith | G01K 1/143 |
| 10,433,467 B2 | | 10/2019 | Hurbi et al. | |
| 10,806,053 B1 | * | 10/2020 | Toleno | G06F 1/203 |

(Continued)

OTHER PUBLICATIONS

"Vapor Chamber Selection Parameters", Advanced Cooling Technologies; Unknown exact publication date but prior to filing of present application; Viewed online at https://www.1-act.com/resources/heat-pipe-fundamentals/different-types-of-heat-pipes/vapor-chambers/.

*Primary Examiner* — Michael A Matey
(74) *Attorney, Agent, or Firm* — Philip H. Burrus, IV (57) ABSTRACT

A wearable electronic device includes a first device housing coupled to a second device housing by at least one strap. The wearable electronic device includes heat generating electronics situated within the first device housing. A heat pipe thermally coupled to the heat generating electronics transfers thermal energy from the heat generating electronics through the at least one neck strap to the second device housing.

20 Claims, 7 Drawing Sheets

(56) References Cited

U.S. PATENT DOCUMENTS

| | | | | |
|---|---|---|---|---|
| 2008/0130221 | A1* | 6/2008 | Varadarajan | G06F 1/203 |
| | | | | 361/679.52 |
| 2015/0245699 | A1* | 9/2015 | Nishi | F28D 20/02 |
| | | | | 224/576 |
| 2015/0359135 | A1* | 12/2015 | Cavallaro | B23P 15/26 |
| | | | | 165/135 |
| 2016/0154442 | A1* | 6/2016 | Shen | G06F 1/163 |
| | | | | 361/679.03 |
| 2016/0255748 | A1* | 9/2016 | Kim | G02B 27/017 |
| | | | | 361/695 |
| 2016/0377328 | A1* | 12/2016 | Hurbi | C09K 5/10 |
| | | | | 62/3.1 |
| 2017/0343293 | A1* | 11/2017 | Hurbi | F28F 21/087 |
| 2018/0376626 | A1* | 12/2018 | Hurbi | G02B 7/002 |
| 2019/0041922 | A1* | 2/2019 | Kurma Raju | H05K 7/2039 |
| 2020/0259062 | A1* | 8/2020 | Boukai | G04C 10/00 |
| 2020/0356143 | A1* | 11/2020 | Oh | G06F 1/1616 |
| 2021/0106459 | A1* | 4/2021 | Caruso | G06F 3/011 |
| 2021/0349322 | A1* | 11/2021 | Harris | G02B 27/0176 |
| 2022/0045592 | A1* | 2/2022 | Huang | G06F 1/1615 |
| 2022/0163809 | A1* | 5/2022 | Lee | G02B 27/0176 |
| 2022/0264767 | A1* | 8/2022 | Tanaka | H04N 23/687 |
| 2022/0317742 | A1* | 10/2022 | Cavallaro | G06F 1/1616 |
| 2022/0346277 | A1* | 10/2022 | Yoon | G02B 27/0176 |
| 2023/0156900 | A1* | 5/2023 | Cavallaro | H05K 7/2039 |
| | | | | 361/679.54 |
| 2023/0309265 | A1* | 9/2023 | Nikkhoo | H05K 7/20336 |
| | | | | 165/5 |

* cited by examiner

WEARABLE ELECTRONIC DEVICE WITH THERMAL ENERGY TRANSFER SYSTEM AND CORRESPONDING METHODS

BACKGROUND

Technical Field

This disclosure relates generally to wearable electronic devices, and more particularly to wearable electronic devices carrying heat generating electronics.

Background Art

Portable electronic devices, such as smartphones, tablet computers, and wearable electronic devices, are becoming ubiquitous in modern society. Many people today own a smart phone or other wireless communication device with which they communicate with friends, workers, and family, manage calendars, purchase goods and services, listen to music, watch videos, play games, and surf the Internet.

As the technology associated with these devices develops, users frequently demand for lighter and thinner devices. Housing walls get thinner, as does the available volume within the device. At the same time, the small yet powerful processors within the device can generate large amounts of thermal energy when operating at maximum capacity. Excess heat can compromise the reliability of interior components, as well as make the device less than comfortable to handle. It would be advantageous to have an improved thermal management system for portable electronic devices.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Before describing in detail embodiments that are in accordance with the present disclosure, it should be observed that the embodiments reside primarily in combinations of method steps and apparatus components related to a wearable electronic device that includes a first device housing coupled to a second device housing by at least one strap, with a heat pipe thermally coupled to heat generating electronics situated in the first device housing and transferring thermal energy from the heat generating electronics through the at least one strap to the second device housing. Any process descriptions or blocks in flow charts should be understood as representing modules, segments, or portions of code which include one or more executable instructions for implementing specific logical functions or steps in the process.

Alternate implementations are included, and it will be clear that functions may be executed out of order from that shown or discussed, including substantially concurrently or in reverse order, depending on the functionality involved. Accordingly, the apparatus components and method steps have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein. It is expected that one of ordinary skill, notwithstanding possibly significant effort and many design choices motivated by, for example, available time, current technology, and economic considerations, when guided by the concepts and principles disclosed herein will be readily capable of generating such methods and systems with minimal experimentation.

Embodiments of the disclosure do not recite the implementation of any commonplace business method aimed at processing business information, nor do they apply a known business process to the particular technological environment of the Internet. Moreover, embodiments of the disclosure do not create or alter contractual relations using generic computer functions and conventional network operations. Quite to the contrary, embodiments of the disclosure employ methods that, when applied to electronic device and/or user interface technology, improve the functioning of the electronic device itself by and improving the overall user experience to overcome problems specifically arising in the realm of the technology associated with electronic device user interaction.

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions.

As used herein, components may be "operatively coupled" when information can be sent between such components, even though there may be one or more intermediate or intervening components between, or along the connection path. The terms "substantially", "essentially", "approximately", "about" or any other version thereof, are defined as being close to as understood by one of ordinary skill in the art, and in one non-limiting embodiment the term is defined to be within ten percent, in another embodiment within five percent, in another embodiment within one percent and in another embodiment within one-half percent. The term "coupled" as used herein is defined as connected, although not necessarily directly and not necessarily mechanically. Also, reference designators shown herein in parenthesis indicate components shown in a figure other than the one in discussion. For example, talking about a device (10) while discussing figure A would refer to an element, 10, shown in figure other than figure A.

Embodiments of the disclosure contemplate that processors and other components disposed within wearable electronic devices, which tend to be quite small and are frequently worn with their device housings abutting a wearer's skin, can generate a lot of heat. Moreover, these components tend to be very small. Thus, while the amount of heat generated may not be extreme compared to, say, an oven or furnace, the fact that the heat is concentrated in a small location that may be adjacent to or touching a user's skin makes it problematic. For example, a central processor operating in a wearable electronic device at a maximum level may generate nine watts. If this heat is not dissipated, it can cause damage to the die, surrounding components, or other circuits. Moreover, it can make the wearable electronic device less than comfortable to handle.

For this reason, some manufacturers limit output power of microprocessors and other high output power components in wearable electronic devices. A manufacturer may limit the maximum output power to be generated for a predefined time such as thirty seconds or less. A maximum output power of nine watts might be scaled back to something on the order of four watts after thirty seconds of full performance operation for instance. This prevents damage to the die of the processor or other semiconductor component, as well as protecting the battery chemistry from compromised reliability. The reduction in power also prevents the housing of the device from exceeding the ambient temperature by more than a few degrees centigrade.

The accompanying reduction in performance comes at a cost, namely, that the speed and number of cores in the processor is reduced, thereby causing complex computational tasks to take longer. The user experience is reduced when the device seems to operate slower, despite having the "latest and greatest" processor inside.

The thermal energy problem is especially problematic in electronic devices worn around the neck. When a wearable electronic device such as an augmented reality neckband, virtual reality neckband, or audio output neckband includes a device housing and a neck strap, the amount of thermal energy that can be dissipated from the surface of the device housing is somewhat limited. Prior art attempts to solve the problem include incorporating thermally conductive layers within the device housing in an attempt to spread the thermal energy over a larger area in an effort to dissipate through radiation. Such solutions have only limited success because dissipation through radiation is limited to the size of the device housing.

Embodiments of the disclosure advantageously provide a solution to this problem by providing a wearable electronic device that includes two device housings, namely, a first device housing and a second device housing. In one or more embodiments, the first device housing is coupled to the second device housing by at least one neck strap. Illustrating by example, in one or more embodiments an anterior pendant comprising heat generating electronics situated therein is coupled to a posterior pendant by a first neck strap and a second neck strap. In one or more embodiments, the first neck strap couples a first side of the anterior pendant to a first side of the posterior pendant. Similarly, a second neck strap couples a second side of the anterior pendant to a second side of the posterior pendant.

In one or more embodiments, the posterior pendant includes a heat spreader situated therein. Examples of a suitable heat spreader include a carbon-based film, a thermally conductive metal, or a vapor chamber. Other examples of heat spreaders will be described below. Still others will be obvious to those of ordinary skill in the art having the benefit of this disclosure.

In one or more embodiments, a flexible heat pipe is thermally coupled to the heat generating electronics and the heat spreader. The flexible heat pipe passes through one of the first neck strap or the second neck strap and transfers thermal energy from the heat generating electronics to the heat spreader for dissipation through the posterior pendant. Simulations show that the first housing portion can reduce the temperature of the anterior pendant by six degrees centigrade or more. Advantageously, embodiments of the disclosure provide a wearable electronic device that allows the internal components to operate at higher wattages without compromising reliability or making the wearable electronic device uncomfortable to wear.

To illustrate embodiments of the disclosure, a wearable audio device will be used as an explanatory wearable electronic device. The wearable audio device is well suited for embodiments of the disclosure because it includes an anterior pendant and a posterior pendant to deliver a stereo image that is aligned with the ears of a wearer. However, it should be noted that this particular form factor is explanatory only, as the thermal dissipation systems described below could be incorporated into other wearable electronic devices, such as one that has a right shoulder device housing and a left shoulder device housing joined by at least one neck strap and so forth.

The explanatory wearable electronic device used for illustrative purposes below provides a sleek, slim, and stylish, wearable, audio electronic device that includes an anterior pendant and a posterior pendant that are connected by two minimalist neck straps. It is not always practical—especially when trying to design a stylish and fashionable electronic device—to place the loudspeakers of a wearable audio electronic device beneath the ears of a wearer. In one or more embodiments, positioning a single loudspeaker in an anterior pendant that provides a monaural audio signal output combining a left channel audio signal output and a right channel audio signal output, while simultaneously providing a left channel audio signal output and a right channel audio signal output from a posterior pendant is sufficient to pull the combined stereo image from the posterior pendant toward the anterior pendant to a central location within the wearable electronic device situated at locations corresponding to a wearer's ears. Using a posterior pendant to deliver separate left and right channel audio, while using an anterior pendant to deliver a combined left and right channel audio output provides a rich, enveloping stereo image that sounds as if located right at the user's ears. As noted, this is just one example of a wearable electronic device into which the thermal energy dissipation systems described below can be integrated. Others will be obvious to those of ordinary skill in the art having the benefit of this disclosure.

Figure 1:
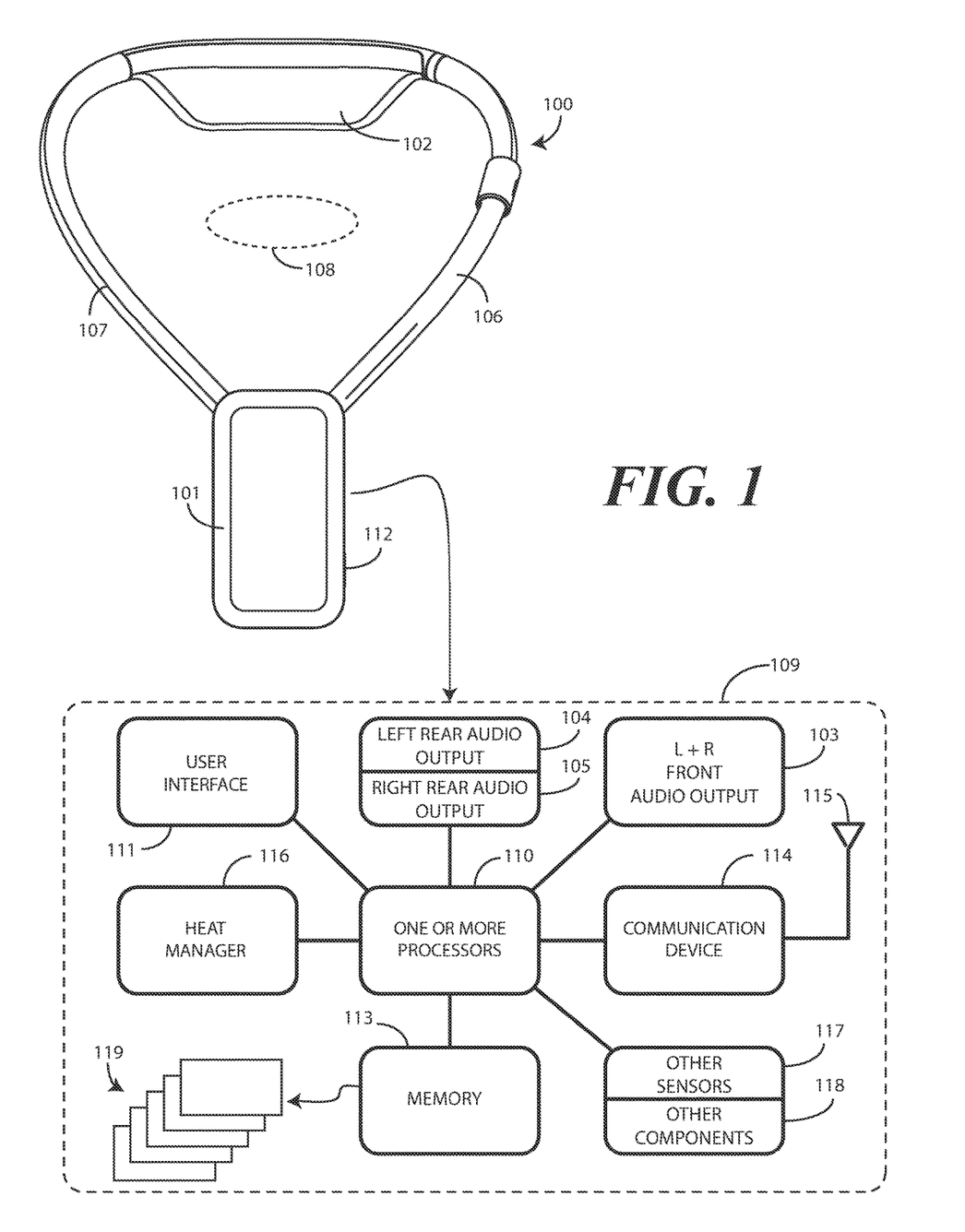
FIG. 1 illustrates one explanatory wearable electronic device in accordance with one or more embodiments of the disclosure.

Turning now to FIG. 1, illustrated therein is one explanatory wearable electronic device 100 configured in accordance with one or more embodiments of the disclosure. In one or more embodiments, the wearable electronic device 100 comprises a first device housing coupled to a second device housing by at least one strap. In the illustrative embodiment of FIG. 1, the first device housing consists of an anterior pendant 101, while the second device housing consists of a posterior pendant 102.

In one or more embodiments, each of the anterior pendant 101 and the posterior pendant 102 includes a housing. The housing can include one or more housing portions, such as a first housing portion and a second housing portion. The housing can define one or more major and minor surfaces of the wearable electronic device 100.

In one or more embodiments, the anterior pendant 101 comprises a single channel anterior audio output 103 delivering a combined left channel audio signal and right channel audio signal through a port of the anterior pendant 101. The posterior pendant 102 comprises a first single channel posterior audio output 104 delivering the left channel audio signal through a first port of the posterior pendant 102 and a second single channel posterior audio output 105 delivering the right channel audio signal through a second port of the posterior pendant 102. The combination of the combined left channel audio signal and right channel audio signal from the anterior pendant 101 and the separated left channel audio signal and right channel audio signal from the posterior pendant 102 pull a perceived stereo image toward the anterior pendant 101 to a centralized location within the wearable electronic device 100.

In one or more embodiments, a first neck strap 106 couples a first side of the anterior pendant 101 to a first side of the posterior pendant 102. In one or more embodiments, a second neck strap 107 couples a second side of the anterior pendant 101 to a second side of the posterior pendant 102.

In one or more embodiments, each of the anterior pendant 101 and the posterior pendant 102 includes a housing, while the first neck strap 106 and the second neck strap 107 serve both as a right shoulder strap and left shoulder strap that allow the wearable electronic device 100 to be worn around the neck as well as to provide a conduit for electrical connections and, as will be explained below, a flexible heat pipe passing from the anterior pendant 101 to the posterior pendant 102 or vice versa. While the anterior pendant 101 and posterior pendant 102 can be configured as shown in FIG. 1, other configurations for each housing and/or shoulder strap and/or other mechanical configurations of wearable electronic devices will be obvious to those of ordinary skill in the art having the benefit of this disclosure.

Also illustrated in FIG. 1 is one explanatory block diagram schematic 109 of the wearable electronic device 100. In one or more embodiments, the block diagram schematic 109 can be constructed as multiple printed circuit board assemblies situated within either the housing of the anterior pendant 101, the housing of the posterior pendant 102, the first neck strap 106, the second neck strap 107, or combinations thereof. While this is one embodiment, in another embodiment the electrical connections between the anterior pendant 101 and the posterior pendant 102 are wireless. Where one or more circuit boards are used, the various components and heat generating electronics can be electrically coupled together by conductors or a bus disposed along one or more printed circuit boards, or alternatively by one or more wireless electronic communication circuits. It should be noted that the block diagram schematic 109 includes many components that are optional, but which are included in an effort to demonstrate how varied electronic devices configured in accordance with embodiments of the disclosure can be.

Illustrating by example, in one or more embodiments the wearable electronic device 100 includes a user interface 111. The user interface 111 can include an audio input device, such as a microphone, to receive audio input. The user interface 111 also includes a plurality of audio output devices to deliver audio output, which in this illustrative embodiment include the single channel anterior audio output 103 of the anterior pendant 101 and the first single channel posterior audio output 104 of the posterior pendant 102 and the second single channel posterior audio output 105 of the posterior pendant 102. Each of the single channel anterior audio output 103 of the anterior pendant 101, the first single channel posterior audio output 104 of the posterior pendant 102, and the second single channel posterior audio output 105 of the posterior pendant 102 can consist of a single loudspeaker in one or more embodiments. However, in other embodiments, multiple loudspeakers can be clustered to form each of the single channel anterior audio output 103 of the anterior pendant 101, the first single channel posterior audio output 104 of the posterior pendant 102, and the second single channel posterior audio output 105 of the posterior pendant 102 as well.

In one or more embodiments, the user interface 111 includes a display, which can optionally be configured to be touch sensitive. Where the wearable electronic device 100 is configured to be a companion electronic device to another electronic device, such as a smartphone, with its companion functionality being that of purely an audio output device, a display would be optional, in it is not required for this aural user interaction convention.

Thus, it is to be understood that the block diagram schematic 109 of FIG. 1 is provided for illustrative purposes only and for illustrating components of one wearable electronic device 100 in accordance with embodiments of the disclosure. The block diagram schematic 109 of FIG. 1 is not intended to be a complete schematic diagram of the various components required for a wearable electronic device 100.

Therefore, other electronic devices in accordance with embodiments of the disclosure may include various other components not shown in FIG. 1 or may include a combination of two or more components or a division of a particular component into two or more separate components, and still be within the scope of the present disclosure.

The illustrative block diagram schematic 109 of FIG. 1 includes many different components. Embodiments of the disclosure contemplate that the number and arrangement of such components can change depending on the particular application. For example, a wearable electronic device that only includes at least one audio output with no audio input may have fewer, or different, components from a wearable electronic device having both user interface components. Similarly, a wearable electronic device that includes at least one audio output in addition to at least one audio input can include multiple audio inputs, one example of which would be a microphone array. Accordingly, electronic devices configured in accordance with embodiments of the disclosure can include some components that are not shown in FIG. 1, and other components that are shown may not be needed and can therefore be omitted.

As noted above, the user interface 111 can include a display, which may optionally be touch sensitive. In one embodiment, users can deliver user input to the display of such an embodiment by delivering touch input from a finger, stylus, or other objects disposed proximately with the display. In one embodiment, the display is configured as an active-matrix organic light emitting diode (AMOLED) display. However, it should be noted that other types of displays, including liquid crystal displays, suitable for use with the user interface would be obvious to those of ordinary skill in the art having the benefit of this disclosure. Where a display is omitted, a user interface component 112, such as a button, switch, touch sensitive surface, or other control mechanism can allow a user to operate the wearable electronic device 100.

In one embodiment, the wearable electronic device 100 includes one or more processors 110. In one embodiment, the one or more processors 110 can include an application processor and, optionally, one or more auxiliary processors. One or both of the application processor and/or the auxiliary processor(s) can include one or more processors. One or both of the application processor and/or the auxiliary processor(s) can be a microprocessor, a group of processing components, one or more ASICs, programmable logic, or other type of processing device.

The application processor and/or the auxiliary processor(s) can be operable with the various components of the block diagram schematic 109. Each of the application processor and/or the auxiliary processor(s) can be configured to process and execute executable software code to perform the various functions of the wearable electronic device 100 with which the block diagram schematic 109 operates. A storage device, such as memory 113, can optionally store the executable software code used by the one or more processors 110 during operation.

In this illustrative embodiment, the block diagram schematic 109 also includes a communication circuit 114 that can be configured for wired or wireless communication with one or more other devices or networks. The networks can include a wide area network, a local area network, and/or personal area network. The communication circuit 114 may also utilize wireless technology for communication, such as, but are not limited to, peer-to-peer or ad hoc communications such as HomeRF, Bluetooth and IEEE 802.11-based communications, as well as other forms of wireless communication such as infrared technology. The communication circuit 114 can include wireless communication circuitry, one of a receiver, a transmitter, or transceiver, and one or more antennas 115.

In one embodiment, the one or more processors 110 can be responsible for performing the primary functions of the electronic device with which the block diagram schematic 109 is operational. For example, in one embodiment the one or more processors 110 comprise one or more circuits operable with the user interface 111 to deliver audio output signals in the form of acoustic waves to a user. The source data for generating these acoustic waves could be stored in the memory 113, or alternatively may be received from an external electronic device using the communication circuit 114. The one or more processors 110 can be operable with an audio output device to deliver audio output to a user. The executable software code used by the one or more processors 110 can be configured as one or more modules 119 that are operable with the one or more processors 110. Such modules 119 can store instructions, control algorithms, media content, digital to analog conversion algorithms, sound generation algorithms, and so forth.

In one or more embodiments, the one or more processors 110 operate with, or as, an audio input/processor. The audio input/processor is operable to receive audio input from a source, such as a person, authorized user, plurality of persons within an environment about the wearable electronic device 100, from the environment about the wearable electronic device 100, or combinations thereof. The audio input/processor can include hardware, executable code, and speech monitor executable code in one embodiment. The audio input/processor can be operable with one or both of an audio input device, such as one or more microphones, and/or the audio output devices, each of which can comprise one, or more than one, loudspeaker as previously described.

In one embodiment, the audio input/processor is configured to implement a voice control feature that allows the wearable electronic device 100 to function as a voice assistant device, which is a digital assistant using voice recognition, speech synthesis, and natural language processing to receive audio input comprising a voice command from a source, determine the appropriate response to the voice command, and then deliver the response in the form of audio output in response to receiving the audio input from the source.

Various sensors 117 can be operable with the one or more processors 110. A first example of a sensor that can be included with the various sensors 117 is a touch sensor. The touch sensor can include a capacitive touch sensor, an infrared touch sensor, resistive touch sensors, or another touch-sensitive technology that serves as a user interface 111 for the wearable electronic device 100.

Another example of a sensor 117 is a geo-locator that serves as a location detector. Location of the wearable electronic device 100 can be determined by capturing the location data from a constellation of one or more earth orbiting satellites, or from a network of terrestrial base stations to determine an approximate location.

One or more motion detectors can be configured as an orientation detector that determines an orientation and/or movement of the wearable electronic device 100 in three-dimensional space. Illustrating by example, the orientation detector can include an accelerometer, a multi-axis accelerometer, gyroscopes, or other device to detect device orientation and/or motion of the wearable electronic device 100. Other sensors 117 suitable for inclusion with the wearable electronic device 100 will be obvious to those of ordinary skill in the art having the benefit of this disclosure.

Other components 118 operable with the one or more processors 110 can include output components such as video, audio, and/or mechanical outputs. For example, the output components may include a video output component or auxiliary devices including a cathode ray tube, liquid crystal display, plasma display, incandescent light, fluorescent light, front or rear projection display, and light emitting diode indicator. Other examples of output components include audio output components such as the one or more loudspeakers used for the single channel anterior audio output 103 of the anterior pendant 101, the first single channel posterior audio output 104 of the posterior pendant 102, and the second single channel posterior audio output 105 of the posterior pendant 102, or other alarms and/or buzzers. The other components 118 can also include a mechanical output component such as vibrating or motion-based mechanisms.

In one or more embodiments, the one or more processors 110 can define one or more process engines. One example of such a process engine is the equalizer/delay manager. In one or more embodiments, the equalizer/delay manager is operable to insert a predefined delay between the combined left channel audio signal and right channel audio signal emanating from the single channel anterior audio output 103 of the anterior pendant 101 and each of the left channel audio signal emanating from the first single channel posterior audio output 104 of the posterior pendant 102 and the right channel audio signal emanating from second single channel posterior audio output 105 of the posterior pendant. This predefined delay ensures that audio signals from the posterior pendant 102, which are closer to the user's ears, arrive at the user's ears at the same time or after as those from the anterior pendant 101, which is farther away. In one or more embodiments, the equalizer/delay manager can also adjust the relative volume levels of sound emanating the combined left channel audio signal and right channel audio signal emanating from the single channel anterior audio output 103 of the anterior pendant 101 and each of the left channel audio signal emanating from the first single channel posterior audio output 104 of the posterior pendant 102 and the right channel audio signal emanating from second single channel posterior audio output 105 of the posterior pendant to affect the overall user experience as well.

Each process engine can be a component of the one or more processors 110, operable with the one or more processors 110, defined by the one or more processors 110, and/or integrated into the one or more processors 110. Other configurations for these process engines, including as software or firmware modules operable on the one or more processors 110, will be obvious to those of ordinary skill in the art having the benefit of this disclosure.

These various hardware components, in operation, can generate a lot of heat. Illustrating by example, the one or more processors 110, which are situated within the anterior pendant 101 in one or more embodiments, constitute heat generating electronics that generate heat when performing the operations of the wearable electronic device 100. Accordingly, in one or more embodiments a heat manager 116 is included to help transfer thermal energy from the anterior pendant 101 to the posterior pendant 102, or vice versa, to help reduce the amount of thermal energy radiated through the device housing.

In one or more embodiments, most of the heat generating electronics are situated within the anterior pendant 101. The amount of thermal energy that can be dissipated through the housing of the anterior pendant 101 is limited by the size of the anterior pendant 101. However, in this explanatory wearable electronic device 100 the posterior pendant 102 provides a large surface area that situates behind the neck of a wearer. In one or more embodiments, while the posterior pendant 102 can also include heat generating electronics, it includes less heat generating electronics than the anterior pendant 101.

Embodiments of the disclosure take advantage of this hardware configuration and transfer thermal energy from the anterior pendant 101 to the posterior pendant 102 using the heat manager 116. In one or more embodiments, the heat manager 116 includes a flexible heat pipe that is integrated into the architecture to transport some of the thermal energy generated in the anterior pendant 101 to the posterior pendant 102. In one or more embodiments, the flexible heat pipe is thermally connected to a printed circuit board carrying the heat generating electronics in the anterior pendant 101. Alternatively, the flexible heat pipe can be coupled to a vapor chamber that is thermally connected to the heat generating electronics.

In one or more embodiments, the flexible heat pipe passes through the first neck strap 106 or the second neck strap 107 and thermally connects the heat generating electronics situated in the anterior pendant 101 to a heat spreader situated in the posterior pendant 102. The flexible heat pipe transfers the thermal energy generated by the heat generating electronics situated in the anterior pendant 101 to the heat spreader situated in the posterior pendant 102 for dissipation through the housing of the posterior pendant 102. The result is a significant reduction in the temperature of the anterior pendant 101, which allows for a higher performance capability by the one or more processors 110 and other heat generating electronics of the block diagram schematic 109.

Thus, in one or more embodiments the heat manager 116 includes a heat pipe that is thermally coupled to heat generating electronics situated within a first device housing defined by the anterior pendant 101. The heat pipe transfers thermal energy from the heat generating electronics through at least one neck strap to the second device housing defined by the posterior pendant 102 for dissipation to the environment. Examples of different configurations of the heat manager 116 are described in more detail below with reference to FIGS. 5-10 and 11-16. Other configurations for the components of the heat manager 116 will be obvious to those of ordinary skill in the art having the benefit of this disclosure.

As noted above, in one or more embodiments the electronic device 100 of FIG. 1 is configured as a wearable audio device. To illustrate how such an explanatory embodiment can function, and turning now to FIGS. 2-3, illustrated therein is the explanatory electronic device 100 of FIG. 1 delivering audio output signals that combine to move a stereo image from a location closer to the posterior pendant 102 to one farther from the posterior pendant 102, closer to the anterior pendant 101, and situated vertically within a columnar boundary defined by the anterior pendant 101, the posterior pendant 102, the first neck strap 106, and the second neck strap 107.

Figure 2:
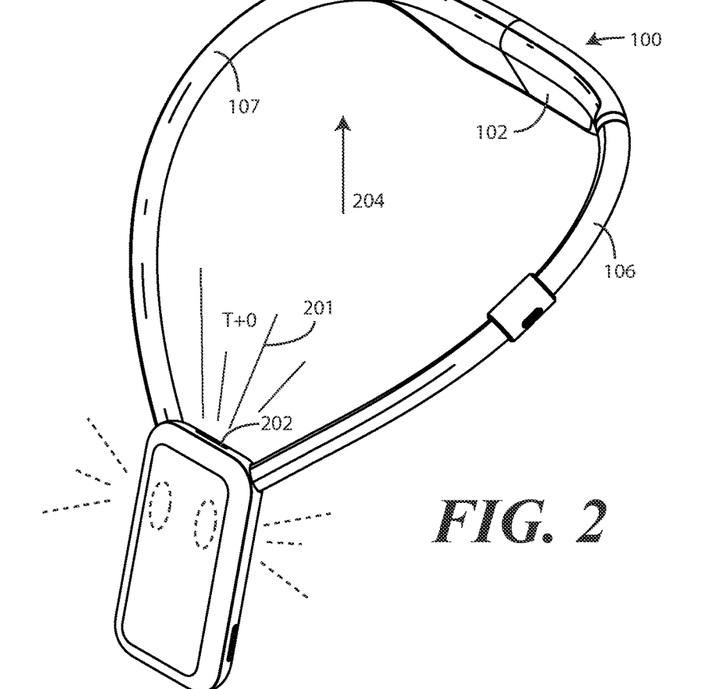
FIG. 2 illustrates a perspective view of one explanatory wearable electronic device in accordance with one or more embodiments of the disclosure.

As shown in FIG. 2, the single channel anterior audio output (103) of the anterior pendant 101 delivers a combined left channel audio signal and right channel audio signal output 201 through a port 202 of the anterior pendant 101. In this illustrative embodiment, the port 202 of the anterior pendant 101 is situated along an upper edge 301 of the anterior pendant 101. This results in the combined left channel audio signal and right channel audio signal output 201 being directed toward a cranial side 204 of the wearable electronic device 100.

Figure 3:
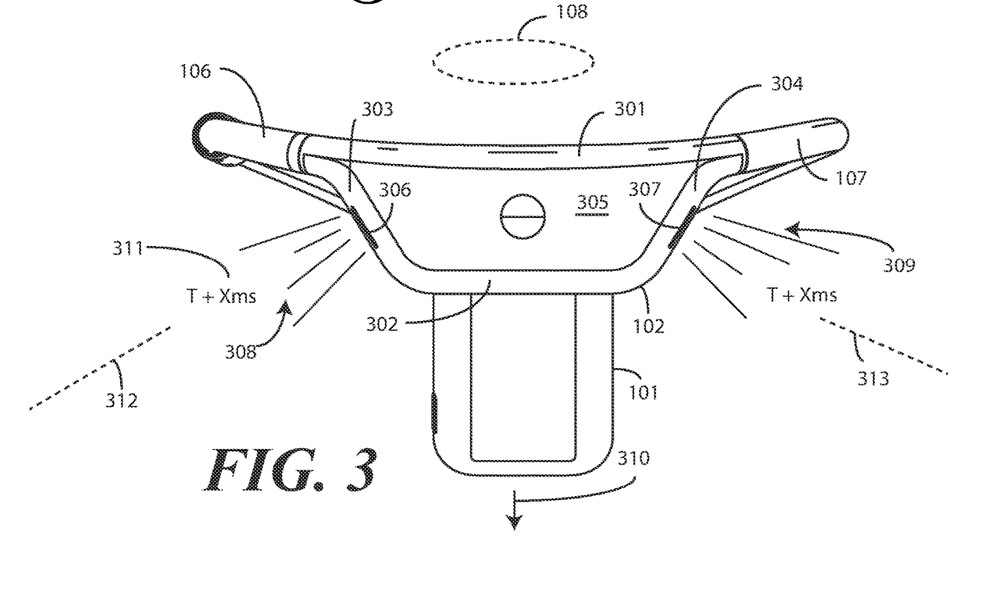
FIG. 3 illustrates a rear elevation view of one explanatory wearable electronic device in accordance with one or more embodiments of the disclosure.

As shown in FIG. 3, the posterior pendant 102 comprises an upper edge 301, a lower edge 302, a first side edge 303, and a second side edge 304. In one or more embodiments, the first side edge 303 and the second side edge 304 taper inward as they extend from the upper edge 301 to the lower edge 302. In so doing, the upper edge 301, which defines a first end of the posterior pendant 102, the lower edge 302, which defines a base of the posterior pendant 102, define a caudally facing (when the wearable electronic device 100 is worn as shown in FIGS. 3-4 below) frustoconical posterior pendant major surface 305. As used herein, "frustoconical" takes its ordinary meaning of the shape of a frustum or cone with its pointed end cut off by a plane running substantially parallel to its base. In this vein, the caudally facing frustoconical posterior pendant major surface is wider at the top than at the bottom with the upper edge 301 being oriented substantially parallel with the lower edge 302, and with the first side edge 303 and second side edge 304 tapering inward as they extend downward (caudally) from the upper edge 301.

In one or more embodiments, the first port 306 of the posterior pendant 102 is situated on the first side edge 303, while the second port 307 of the posterior pendant 102 is situated on the second side edge 304. This arrangement, counterintuitively, causes the left channel audio signal output 308 and the right channel audio signal output 309 to be directed downward, i.e., toward a caudal side 310 of the wearable electronic device 100 and away from each other. This orientation results in central axes 312,313 of the first port 306 of the posterior pendant 102 and the second port 307 of the posterior pendant 102, which pass from an interior of the posterior pendant 102 to an exterior of the posterior pendant 102, extending downward from the upper edge 301 of the posterior pendant 102 and away from each other. Thus, the left channel audio signal output 308 is delivered downward and away from both the posterior pendant 102 and the right channel audio signal output 309, while the right channel audio signal output 309 is delivered downward and away from both the posterior pendant 102 and the left channel audio signal output 308.

While perhaps initially counterintuitive, delivering the left channel audio signal output 308 and right channel audio signal output 309 downward and away from the posterior pendant 102 at roughly forty-five degree angles maximizes the aural separation of each channel, thereby improving the robustness and richness of the stereo image 108 resulting from the combination of the combined left channel audio signal output and right channel audio signal output 201 from the port 202 in the anterior pendant 101 and the left channel audio signal output 308 and the right channel audio signal output 309 from the first port 306 and second port 307 of the posterior pendant 102.

As shown in FIGS. 2-3, in one or more embodiments when the wearable electronic device 100 is worn the anterior pendant 101 is farther from the user's ears than is the posterior pendant 102. Consequently, the port 202 of the anterior pendant 101 is farther from the user's ears than either the first port 306 of the posterior pendant 102 or the second port 307 of the posterior pendant 102. Accordingly, it takes more time for the combined left channel audio signal and right channel audio signal output 201 to reach the user's ears than either the left channel audio signal output 308 or right channel audio signal output 309.

To compensate, in one or more embodiments one or more processors (110) of the wearable electronic device 100 insert a predefined delay 311 between the combined left channel audio signal and right channel audio signal output 201 emanating from the single channel anterior audio output (103) and each of the left channel audio signal output 308 and right channel audio signal output 309 emanating from the first single channel posterior audio output (104) and the second single channel posterior audio output (105), respectively. Since sound travels at 1100 feet per second, which is roughly one millisecond per foot, in one or more embodiments the predefined delay 311 is about one millisecond. Embodiments of the disclosure contemplate that delays over three milliseconds will affect the desirability of the stereo image 108. Accordingly, in one or more embodiments the predefined delay 311 is less than three milliseconds. As previously described, the predefined delay 311 can be user definable in one or more embodiments.

Figure 4:
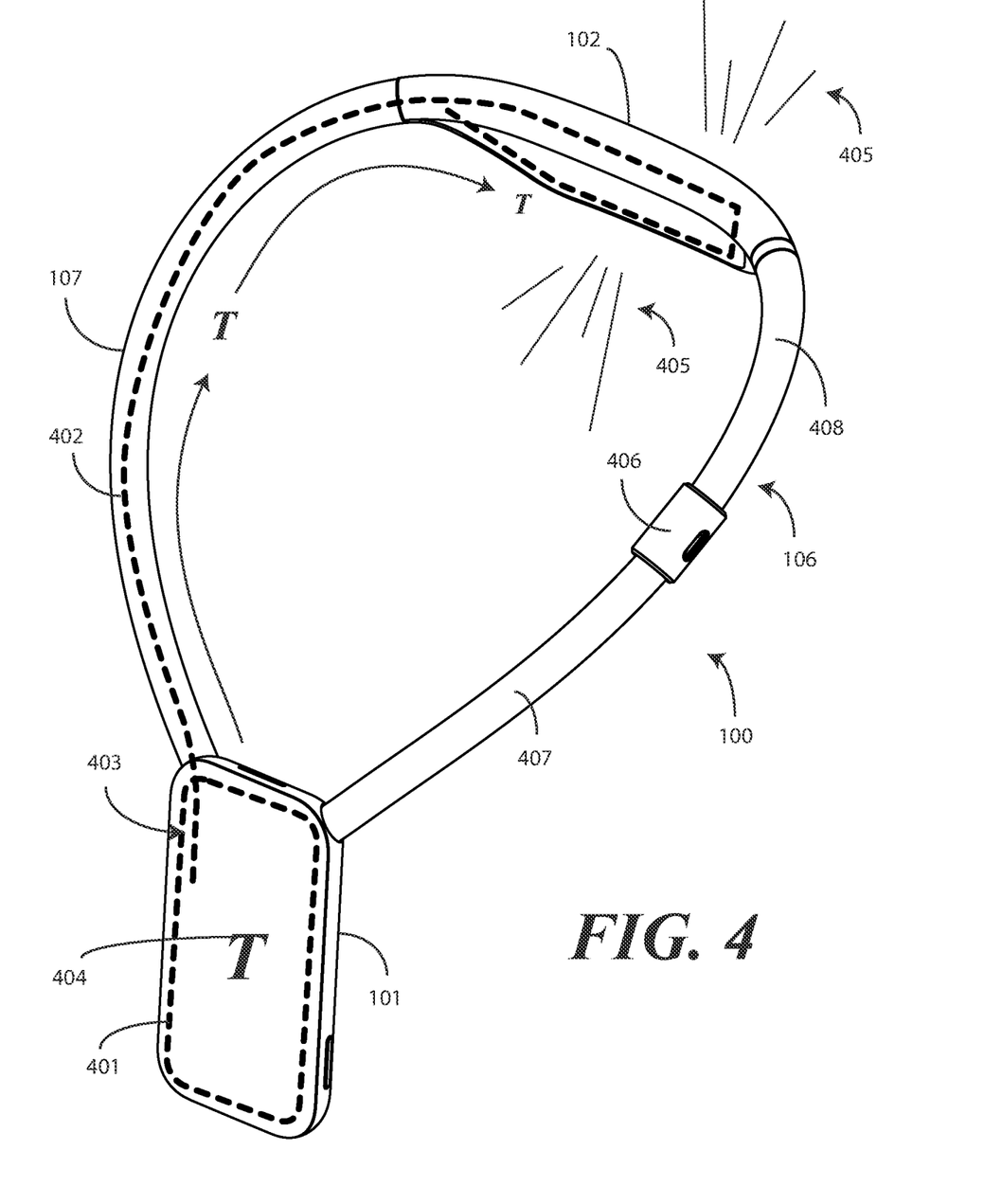
FIG. 4 illustrates a schematic diagram of one explanatory wearable electronic device in accordance with one or more embodiments of the disclosure.

Regardless of whether the components of the electronic device 100 are delivering audio as described above with reference to FIGS. 2-3, or are performing other functions, in one or more embodiments they generate heat when performing the functions of the electronic device 100. In one or more embodiments, the electronic components situated in the anterior pendant 101 generate more heat than do the components (where there are components) situated in the posterior pendant 102. Turning now to FIG. 4, illustrated therein is one explanatory system with which the heat generated by the heat generating electronics situated in the anterior pendant 101 can be transferred to the posterior pendant 102 for dissipation to the environment through the device housing of the posterior pendant 102.

As shown in FIG. 4, the electronic device 100 includes a first device housing, shown illustratively as the anterior pendant 101, and a second device housing, shown illustratively as the posterior pendant 102. Heat generating electronics 401, which could be any of the components described above with reference to FIG. 1, including the one or more processors (110), the communication circuit (114), the memory (113), the sensors (117), or other components (118), are situated within the first device housing defined by the anterior pendant 101.

In one or more embodiments, a heat pipe 402 is thermally coupled 403 to the heat generating electronics 401. In one or more embodiments, the heat pipe 402 is flexible and passes through a neck strap 107 coupling the anterior pendant 101 to the posterior pendant 102. While shown passing through the second neck strap 107 in FIG. 4, the heat pipe 402 could equally pass through the first neck strap 106 as well. In still other embodiments, two heat pipes can be included, with one passing through the first neck strap 106 and another passing through the second neck strap 107, and so forth. In the illustrative embodiment of FIG. 4, the heat pipe 402 passes only through the second neck strap 107.

In one or more embodiments, the heat pipe 402 transfers thermal energy 404 from the heat generating electronics 401 through the second neck strap 107 to the second device housing defined by the posterior pendant 102. While the posterior pendant 102 can include heat generating electronics as well, in the illustrative embodiment of FIG. 4 the other heat generating electronics situated in the posterior pendant 102 generate less heat than to the heat generating electronics 401 situated within the anterior pendant 101. Said differently, in one or more embodiments when other heat generating electronics are situated within the second device housing defined by the posterior pendant 102, the heat generating electronics 401 situated within the first device housing defined by the anterior pendant 101 generate more heat than the other heat generating electronics situated in the posterior pendant 102. Consequently, transferring the thermal energy 404 through the heat pipe 402 to the posterior pendant 102 not only cools the anterior pendant 101, but allows that thermal energy 404 to be dissipated 405 through the device housing of the posterior pendant 102 to the environment.

In this illustrative embodiment, the first neck strap 106 includes a first first neck strap portion 407 and a second first neck strap portion 408. A coupler 406 attaches the first first neck strap portion 407 to the second first neck strap portion 408. The inclusion of the coupler 406 allows a wearer to separate the first neck strap 106, place the wearable electronic device 100 around their neck, and then reattach the first neck strap 106 to don the wearable electronic device 100.

Figure 5:
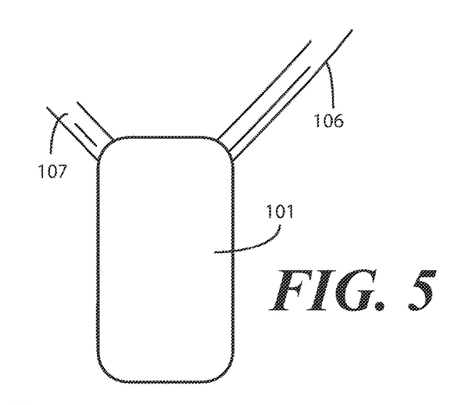
FIG. 5 illustrates one explanatory anterior pendant in accordance with one or more embodiments of the disclosure.
Figure 6:
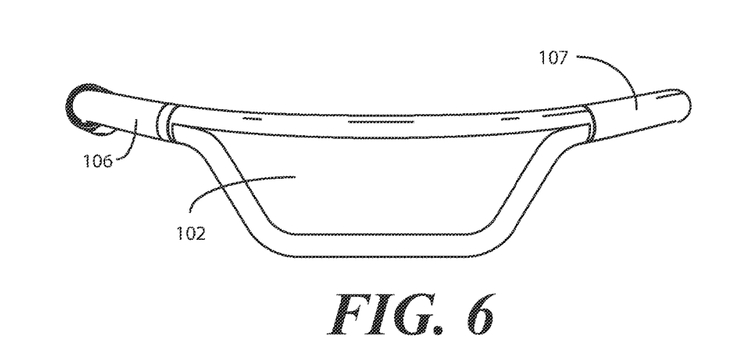
FIG. 6 illustrates one explanatory posterior pendant in accordance with one or more embodiments of the disclosure.
Figure 7:
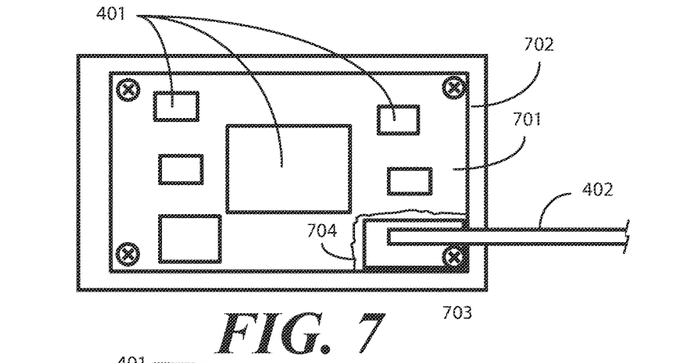
FIG. 7 illustrates a top plan view of one explanatory thermal management system suitable for incorporation into the anterior pendant of FIG. 5.
Figure 8:
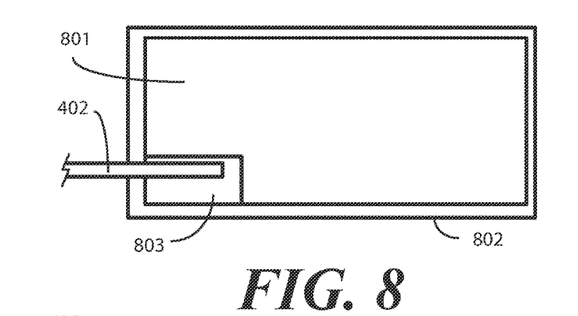
FIG. 8 illustrates a top plan view of one explanatory thermal management system suitable for incorporation into the posterior pendant of FIG. 6.
Figure 9:
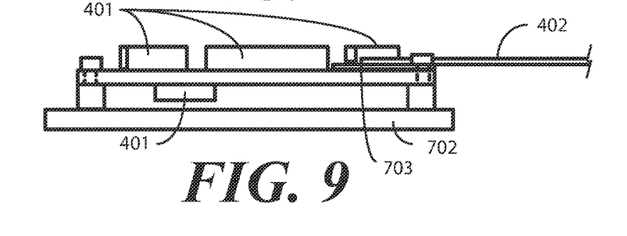
FIG. 9 illustrates a side elevation view of one explanatory thermal management system suitable for incorporation into the anterior pendant of FIG. 5.
Figure 10:
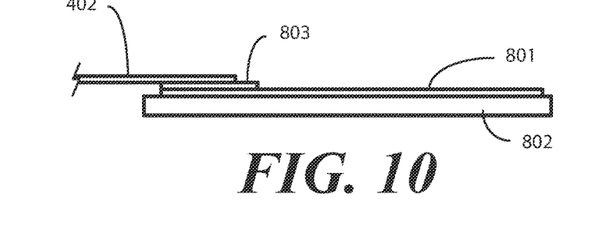
FIG. 10 illustrates a side elevation view of one explanatory thermal management system suitable for incorporation into the posterior pendant of FIG. 6.

Turning now to FIGS. 5-10, illustrated therein is a first architecture by which the general system of FIG. 4 can be achieved. FIG. 5 illustrates the anterior pendant 101, while FIGS. 7 and 9 illustrate components situated within the anterior pendant 101. FIG. 7 illustrates these components in plan view, while FIG. 9 illustrates these components in a side elevation view. Similarly, FIG. 6 illustrates the posterior pendant 102, while FIGS. 8 and 10 illustrate components that can be positioned inside the posterior pendant 102. FIG. 8 illustrates these components in plan view, while FIG. 10 illustrates the components in side elevation view.

In one or more embodiments, a printed circuit board 701 supports the heat generating electronics 401, which are shown as integrated circuit components. In this illustrative example, the printed circuit board 701 is suspended from a device housing 702 defining a sidewall of the anterior pendant 101 by a plurality of bosses. A plurality of screws fixedly couples the printed circuit board 701 to the bosses, thereby preventing the printed circuit board 701 from moving relative to the device housing.

While the heat pipe 402 can be coupled directly to thermally conductive layers of the printed circuit board 701, which include a copper layer defining electrical traces or a ground plane, in this illustrative embodiment a thermal flange 703, which can be a thermally conductive metal or other material, couples the heat pipe 402 to the printed circuit board 701. In one or more embodiments, the heat pipe 402 is soldered to the thermal flange 703. In this illustrative embodiment, the thermal flange 703 is bolted to the printed circuit board 701 by one of the screws retaining the printed circuit board 701 to the bosses suspending the printed circuit board 701 above the device housing 702 of the anterior pendant 101. In other embodiments, the thermal flange 703 can be soldered to the printed circuit board 701.

Where mechanically coupled to the printed circuit board 701, as shown in FIGS. 7 and 9, a thermal interface material may be positioned between one or both of the thermal flange 703 and the printed circuit board 701 and/or the heat pipe 402 and the thermal flange 703. One example of such a thermal interface material is thermally conductive grease. Other examples of thermal interface materials suitable to increase the thermal coupling between the thermal flange 703 and the printed circuit board 701 will be obvious to those of ordinary skill in the art having the benefit of this disclosure.

In this illustrative embodiment, the thermal flange 702 has a minor dimension shown in FIG. 7 that is wider than another minor dimension of the heat pipe 402. In this illustrative embodiment, the minor dimension of the thermal flange 703 is over four times greater than the minor dimension of the heat pipe 402. In this illustrative embodiment, the thermal flange 703 is coupled to a corner of the printed circuit board 701. In one or more embodiments, the heat pipe 402 is coupled to the thermal flange 703 such that an offset exists between an end of the heat pipe 402 and a side edge of the thermal flange 703.

As shown in FIGS. 8 and 10, the heat pipe 402—after passing through at least one neck strap—is then coupled to a heat spreader 801 positioned within the posterior pendant 102. In this illustrative embodiment, the heat spreader 801 is coupled to a device housing 802 of the posterior pendant 102. The function of the heat spreader 801 is to distribute the thermal energy delivered by the heat pipe 402 from the heat generating electronics 401 across a larger surface area so the thermal energy can be dissipated through the device housing 802 of the posterior pendant 102.

The heat spreader 801 can be manufactured from a variety of thermally conductive materials. In one or more embodiments, the heat spreader 801 is a large section of thermally conductive material coupled to the device housing 802 of the posterior pendant 102. Illustrating by example, the heat spreader 801 may be a section of copper, aluminum, or other metal material. In other embodiments, the heat spreader 801 is manufactured from a carbon-based film and is attached to the device housing 802 of the posterior pendant 102 by a thermally conductive adhesive. Other materials suitable for making the heat spreader 801 will be obvious to those of ordinary skill in the art having the benefit of this disclosure.

In still other embodiments, the heat spreader 801 comprises a vapor chamber. Since the heat pipe 402 transfers the thermal energy in a direction defined by its major axis, the vapor chamber collects this thermal energy and spreads it for dispersion to the environment. Effectively, the vapor chamber defines a planar heat pipe that spreads the thermal energy received from the heat pipe 402 passing through the at least one neck strap in two dimensions. This thermal energy vaporizes a liquid in an evaporator wick situated within the vapor chamber. The now vaporized liquid condenses on the inner surfaces of the vapor chamber, where the thermal energy dissipates via convection to the device housing 802 of the posterior pendant 102. Capillary action then draws the liquid back to the evaporator wick.

Regardless of form, the function of the heat spreader 801 situated within the device housing 802 of the posterior pendant 102 is to dissipate thermal energy transferred by the heat pipe 402 through the at least one neck strap through the second device housing 802 of the posterior pendant 102. In this illustrative embodiment, another thermal flange 803 couples the heat pipe 402 to the heat spreader 801. As with the thermal flange 703 of FIGS. 7 and 9, the thermal flange 803 of FIGS. 8 and 10 is soldered to the other thermal flange 803. In this illustrative embodiment, the other thermal flange 803 is then soldered to the heat spreader 801.

In other embodiments, the other thermal flange 803 can be mechanically coupled to the heat spreader 801. Where mechanically coupled to the heat spreader 801, a thermal interface material may be positioned between one or both of the other thermal flange 803 and the heat spreader 801 and/or the heat pipe 402 and the other thermal flange 803. One example of such a thermal interface material is thermally conductive grease, as noted above. Other examples of thermal interface materials suitable to increase the thermal coupling between the other thermal flange 803 and the heat spreader 801 will be obvious to those of ordinary skill in the art having the benefit of this disclosure.

In this illustrative embodiment, the thermal flange 803 has a minor dimension shown in FIG. 8 that is wider than another minor dimension of the heat pipe 402. In this illustrative embodiment, the minor dimension of the thermal flange 803 is over four times greater than the minor dimension of the heat pipe 402. In this illustrative embodiment, the thermal flange 803 is coupled to a corner of the heat spreader 801. In one or more embodiments, the heat pipe 402 is coupled to the thermal flange 803 such that an offset exists between an end of the heat pipe 402 and a side edge of the thermal flange 803.

Thus, as shown in FIGS. 5-10, a wearable electronic device includes an anterior pendant 101 comprising heat generating electronics 401 situated therein. A posterior pendant 102 includes a heat spreader 801 situated therein.

A first neck strap 106 couples a first side of the anterior pendant 101 to a first side of the posterior pendant 102. A second neck strap 107 couples a second side of the anterior pendant 101 to a second side of the posterior pendant 102. A heat pipe 402, which is flexible in this embodiment, is thermally coupled to the heat generating electronics 401 and the heat spreader 801. The heat pipe 402 transfers thermal energy from the heat generating electronics 401 to the heat spreader 801 for dissipation through the posterior pendant 102.

A printed circuit board 701 is situated within the anterior pendant 101 and supports the heat generating electronics 401. A thermal flange 703 thermally couples the heat pipe 402 to the printed circuit board 701. In this illustration, the thermal flange 703 is bolted to the printed circuit board 701.

Figures 11, 12:
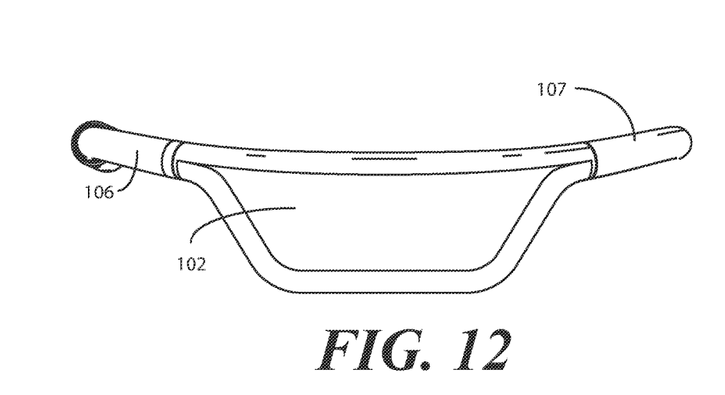
FIG. 11 illustrates another explanatory anterior pendant in accordance with one or more embodiments of the disclosure.
FIG. 12 illustrates another explanatory posterior pendant in accordance with one or more embodiments of the disclosure.
Figure 11:
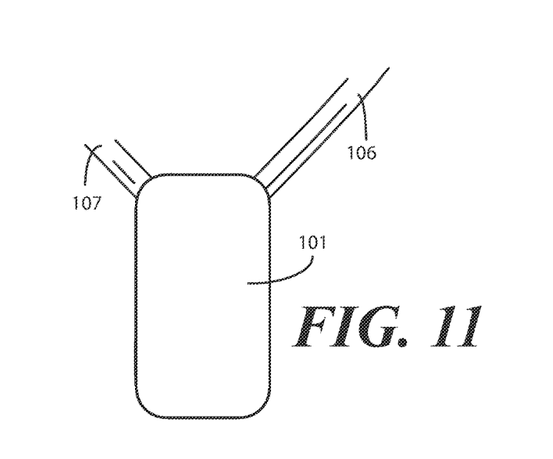
Figure 13:
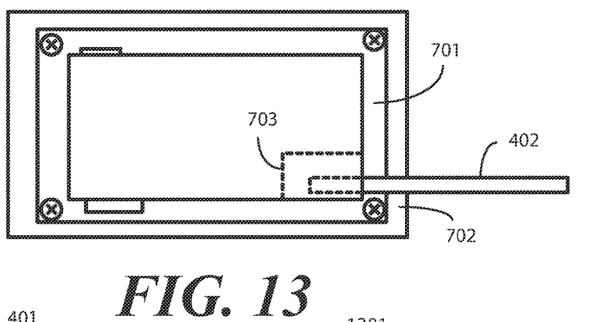
FIG. 13 illustrates a top plan view of one explanatory thermal management system suitable for incorporation into the anterior pendant of FIG. 11.
Figure 14:
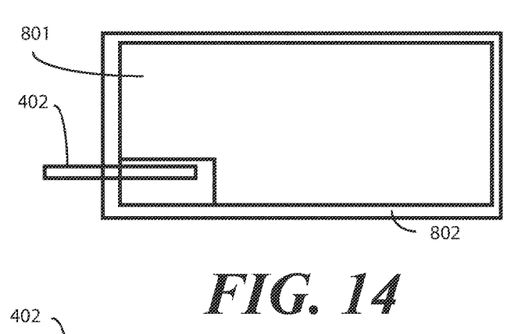
FIG. 14 illustrates a top plan view of one explanatory thermal management system suitable for incorporation into the posterior pendant of FIG. 12.
Figure 15:
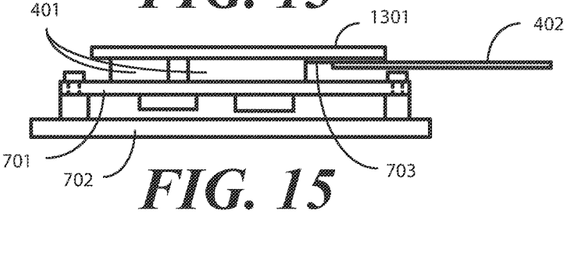
FIG. 15 illustrates a side elevation view of one explanatory thermal management system suitable for incorporation into the anterior pendant of FIG. 11.
Figure 16:
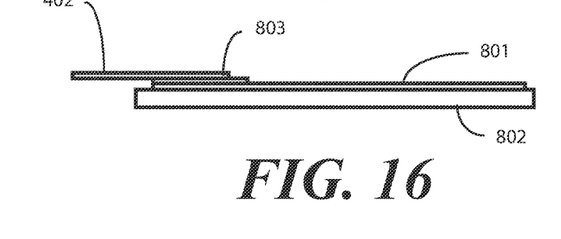
FIG. 16 illustrates a side elevation view of one explanatory thermal management system suitable for incorporation into the posterior pendant of FIG. 12.

Turning now to FIGS. 11-16, illustrated therein is a second architecture by which the general system of FIG. 4 can be achieved. FIG. 11 illustrates the anterior pendant 101, while FIGS. 13 and 15 illustrate components situated within the anterior pendant 101. FIG. 13 illustrates these components in plan view, while FIG. 15 illustrates these components in a side elevation view. Similarly, FIG. 12 illustrates the posterior pendant 102, while FIGS. 14 and 16 illustrate components that can be positioned inside the posterior pendant 102. FIG. 12 illustrates these components in plan view, while FIG. 14 illustrates the components in side elevation view.

As before, a printed circuit board 701 supports the heat generating electronics 401. In this illustrative example, the printed circuit board 701 is suspended from a device housing 702 defining a sidewall of the anterior pendant 101 by a plurality of bosses. A plurality of screws fixedly couples the printed circuit board 701 to the bosses, thereby preventing the printed circuit board 701 from moving relative to the device housing.

In this illustrative embodiment, another heat spreader 1301 is situated in the device housing 702 defining the anterior pendant 101. The other heat spreader 1301 thermally couples the heat pipe 402 to the heat generating electronics 401. In this illustrative embodiment, the bottoms of the heat generating electronics 401 are coupled to the printed circuit board 701, while the other heat spreader 1301 is coupled to the tops of the heat generating electronics 401. This results in the other heat spreader 1301 and the printed circuit board 701 being physically separated by the heat generating electronics 401.

While the heat pipe 402 can be coupled directly to the other heat spreader 1301, in this illustrative embodiment a thermal flange 703, which can be a thermally conductive metal or other material, couples the heat pipe 402 to the other heat spreader 1301. In one or more embodiments, the heat pipe 402 is soldered to the thermal flange 703. In this illustrative embodiment, the thermal flange 703 is then soldered to the other heat spreader 1301. In other embodiments, the thermal flange 703 can be mechanically coupled to the other heat spreader 1301.

Where mechanically coupled to the other heat spreader 1301, a thermal interface material 704 may be positioned between one or both of the thermal flange 703 and the other heat spreader 1301 and/or the heat pipe 402 and the thermal flange 703. One example of such a thermal interface material 704 is thermally conductive grease. Other examples of thermal interface materials will be obvious to those of ordinary skill in the art having the benefit of this disclosure.

In this illustrative embodiment, the thermal flange 703 has a minor dimension shown in FIG. 13 that is wider than another minor dimension of the heat pipe 402. In this illustrative embodiment, the minor dimension of the thermal flange 703 is over four times greater than the minor dimension of the heat pipe 402. In this illustrative embodiment, the thermal flange 703 is coupled to a corner of the other heat spreader 1301. In one or more embodiments, the heat pipe 402 is coupled to the thermal flange 703 such that an offset exists between an end of the heat pipe 402 and a side edge of the thermal flange 703.

As shown in FIGS. 14 and 16, the heat pipe 402—after passing through at least one neck strap—is then coupled to a heat spreader 801 positioned within the posterior pendant 102. In this illustrative embodiment, the heat spreader 801 is coupled to a device housing 802 of the posterior pendant 102. The function of the heat spreader 801 is to distribute the thermal energy delivered by the heat pipe 402 from the heat generating electronics 401 across a larger surface area so the thermal energy can be dissipated through the device housing 802 of the posterior pendant 102.

The heat spreader 801 can be manufactured from a variety of thermally conductive materials. In one or more embodiments, the heat spreader 801 is a large section of thermally conductive material, such as copper, which is coupled to the device housing 802 of the posterior pendant 102. In other embodiments, the heat spreader 801 is manufactured from a carbon-based film and is attached to the device housing 802 of the posterior pendant 102 by a thermally conductive adhesive. Other materials suitable for making the heat spreader 801 will be obvious to those of ordinary skill in the art having the benefit of this disclosure. In still other embodiments, the heat spreader 801 comprises a vapor chamber.

Regardless of form, the function of the heat spreader 801 situated within the device housing 802 of the posterior pendant 102 is to dissipate thermal energy transferred by the heat pipe 402 through the at least one neck strap through the second device housing 802 of the posterior pendant 102. In this illustrative embodiment, another thermal flange 803 couples the heat pipe 402 to the heat spreader 801. As with the thermal flange 703 of FIGS. 13 and 15, the other thermal flange 803 of FIGS. 14 and 16 is soldered to the heat pipe 402. In this illustrative embodiment, the other thermal flange 803 is then soldered to the heat spreader 801.

In other embodiments, the other thermal flange 803 can be mechanically coupled to the heat spreader 801. Where mechanically coupled to the heat spreader 801, a thermal interface material, such as thermal grease, may be positioned between one or both of the other thermal flange 803 and the heat spreader 801 and/or the heat pipe 402 and the other thermal flange 803.

In this illustrative embodiment, the other thermal flange 803 has a minor dimension shown in FIG. 14 that is wider than another minor dimension of the heat pipe 402. In this illustrative embodiment, the minor dimension of the other thermal flange 803 is over four times greater than the minor dimension of the heat pipe 402. In this illustrative embodiment, the other thermal flange 803 is coupled to a corner of the heat spreader 801. In one or more embodiments, the heat pipe 402 is coupled to the other thermal flange 803 such that an offset exists between an end of the heat pipe 402 and a side edge of the other thermal flange 803.

Thus, as shown in FIGS. 11-16, a wearable electronic device includes an anterior pendant 101 comprising heat generating electronics 401 situated therein. A posterior pendant 102 includes a heat spreader 801 situated therein. Another heat spreader 1301 is situated within the anterior pendant 101.

A first neck strap 106 couples a first side of the anterior pendant 101 to a first side of the posterior pendant 102. A second neck strap 107 couples a second side of the anterior pendant 101 to a second side of the posterior pendant 102. A heat pipe 402, which is flexible in this embodiment, is thermally coupled to the other heat spreader 1301 situated within the anterior pendant 101. In this illustrative embodiment, the heat pipe 402 is thermally coupled to the other heat spreader 1301 by a thermal flange 703, with the other heat spreader 1301 thermally coupling the heat generating electronics 401 to the heat pipe 402. The heat pipe 402 transfers thermal energy from the other heat spreader 1301 abutting the heat generating electronics 401 to the heat spreader 801 in the posterior pendant 102 for dissipation through the device housing 802 of the posterior pendant 102.

A printed circuit board 701 is situated within the anterior pendant 101 and supports the heat generating electronics 401. The printed circuit board 701 is physically separated from the other heat spreader 1301 situated in the anterior pendant 101.

Figure 17:
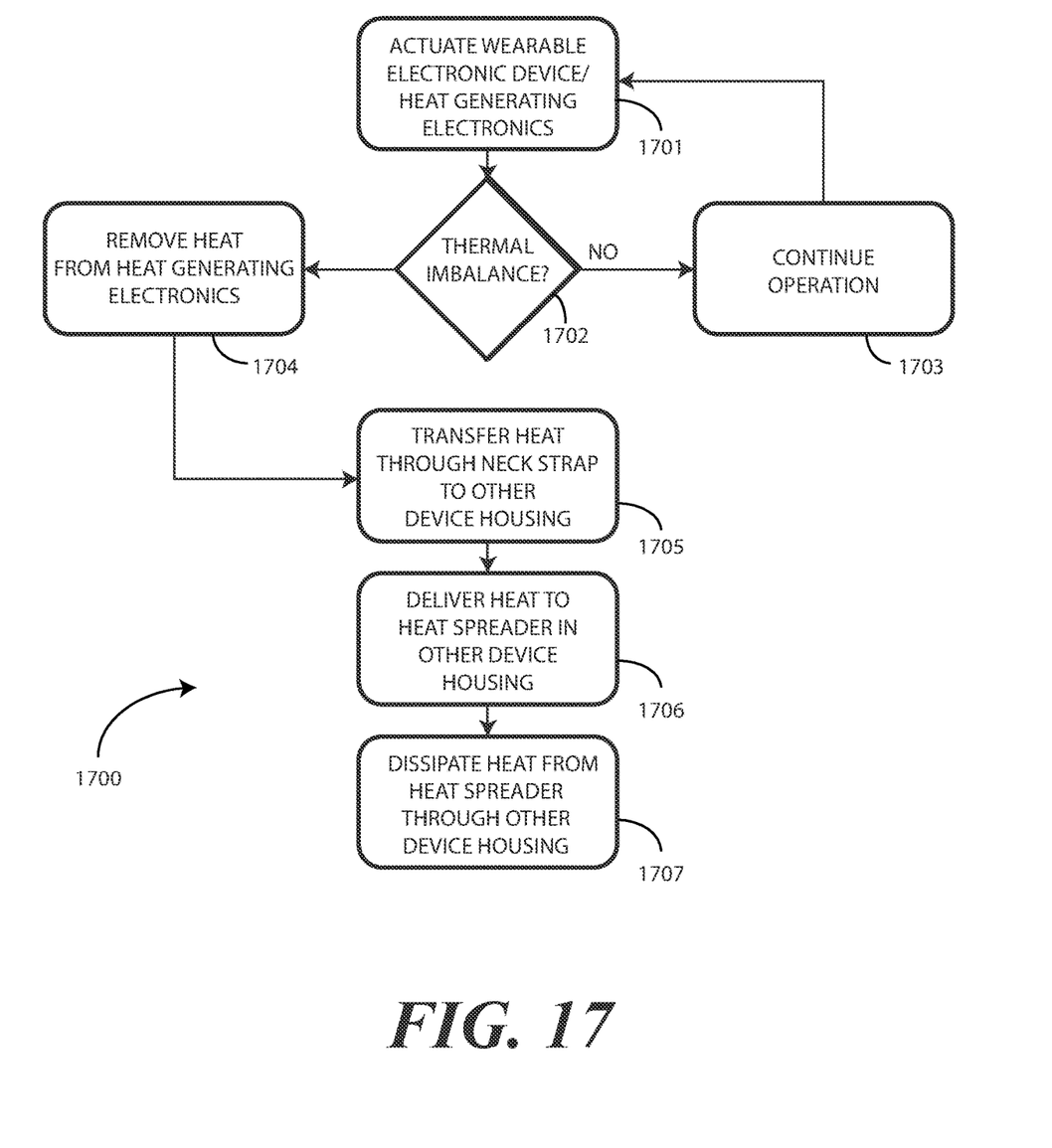
FIG. 17 illustrates one explanatory method in accordance with one or more embodiments of the disclosure.

Turning now to FIG. 17, illustrated therein is one explanatory method 1700 of removing thermal energy from a first device housing of a wearable electronic device and transferring that thermal energy to a second device housing of the wearable electronic device in accordance with one or more embodiments of the disclosure. The method 1700 of FIG. 17 removes thermal energy from a first device housing of the wearable electronic device, transfers the thermal energy through a flexible heat pipe passing from the first device housing through a strap coupling the first device housing to the second device housing and into the second device housing, and dissipates the thermal energy through the second device housing.

Beginning at step 1701, the wearable electronic device is actuated. In one or more embodiments, the first device housing of the wearable electronic device is configured as an anterior pendant and includes heat generating electronics. Accordingly, the actuation occurring at step 1701 causes the heat generating electronics to generate heat in addition to making the wearable electronic device operational.

Decision 1702 determines whether there is a thermal imbalance between the first device housing and the second device housing. Illustrating by example, if both the first device housing and the second device housing include heat generating electronics with the heat generating electronics in the first device housing generating more thermal energy than the heat generating electronics in the second device housing, there will be a thermal imbalance. Where this occurs, step 1704 comprises removing the thermal energy from the first device housing of the wearable electronic device. Otherwise, the wearable electronic device continues to operate normally at step 1703.

Step 1705 comprises transferring the thermal energy through a flexible heat pipe passing from the first device housing through a strap coupling the first device housing to the second device housing. Step 1706 then comprises delivering the thermal energy into the second device housing.

In one or more embodiments, step 1705 comprises transferring the thermal energy from the heat generating electronics situated within the first device housing through a heat spreader to the flexible heat pipe. In one or more embodiments, the heat spreader is physically separated from a printed circuit board supporting the heat generating electronics.

Step 1707 then comprises dissipating the thermal energy through the second device housing, which is configured as an anterior pendant in one or more embodiments. In one or more embodiments, this dissipation occurring at step 1707 comprises delivering the thermal energy to another heat spreader situated within the second device housing. Alternatively, the dissipation occurring at step 1707 comprises delivering the thermal energy to a vapor chamber situated within the second device housing. Other techniques for dissipating the thermal energy at step 1707 will be obvious to those of ordinary skill in the art having the benefit of this disclosure.

Figure 18:
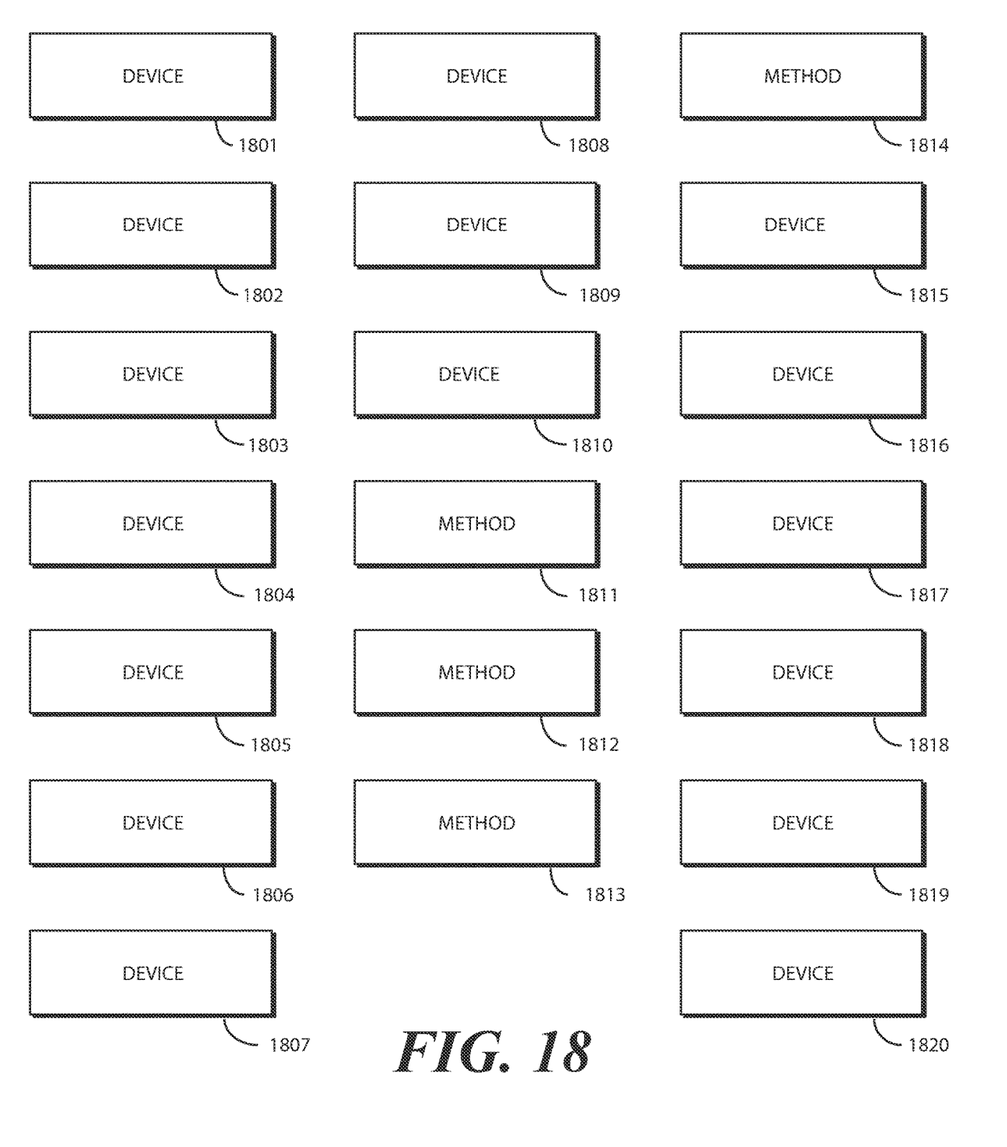
FIG. 18 illustrates various embodiments of the disclosure.

Turning now to FIG. 18, illustrated therein are various embodiments of the disclosure. The embodiments of FIG. 18 are shown as labeled boxes in FIG. 18 due to the fact that the individual components of these embodiments have been illustrated in detail in FIGS. 1-17, which precede FIG. 18. Accordingly, since these items have previously been illustrated and described, their repeated illustration is no longer essential for a proper understanding of these embodiments. Thus, the embodiments are shown as labeled boxes.

At 1801, a wearable electronic device comprises a first device housing coupled to a second device housing by at least one strap. At 1801, heat generating electronics are situated within the first device housing.

At 1801, a heat pipe is thermally coupled to the heat generating electronics. At 1801, the heat pipe transfers thermal energy from the heat generating electronics through the at least one neck strap to the second device housing.

At 1802, the wearable electronic device of 1801 further comprises other heat generating electronics situated within the second device housing. At 1802, the heat generating electronics situated within the first device housing generate more heat than the other heat generating electronics.

At 1803, the wearable electronic device of 1802 further comprises a heat spreader situated within the second device housing. At 1803, the heat spreader dissipates the thermal energy transferred by the heat pipe through the at least one strap through the second device housing. At 1803, a thermal flange thermally couples the heat spreader to the heat pipe.

At 1804, the wearable electronic device of 1803 further comprises a printed circuit board supporting the heat generating electronics. At 1804, another thermal flange thermally couples the heat pipe to the printed circuit board.

At 1805, the wearable electronic device of 1804 further comprises a thermal interface material positioned between one or both of the thermal flange and the printed circuit board and/or the other thermal flange and the heat spreader. At 1806, the heat spreader of 1804 comprises a vapor chamber.

At 1807, the wearable electronic device of 1803 further comprises a printed circuit board supporting the heat generating electronics. At 1807, the wearable electronic device comprises another heat spreader situated in the first device housing. At 1807, the other heat spreader thermally couples the heat pipe to the heat generating electronics. At 1808, the printed circuit board and the heat spreader are physically separated.

At 1809, the first device housing of 1801 comprises an anterior pendant. At 1809, the second device housing of 1801 comprises a posterior pendant.

At 1809, the at least one strap of 1801 comprises a first neck strap coupling a first side of the anterior pendant to a first side of the posterior pendant and a second neck strap coupling a second side of the anterior pendant to a second side of the posterior pendant. At 1809, the heat pipe of 1801 comprises a flexible heat pipe passing through the first neck strap.

At 1810 the second neck strap of 1809 comprises a first second neck strap portion and a second second neck strap portion. At 1810, the second neck strap further comprises a coupler to attach the first second neck strap portion and the second second neck strap portion together.

At 1811, a method of cooling a wearable electronic device comprises removing thermal energy from a first device housing of the wearable electronic device. At 1811, the method comprises transferring the thermal energy through a flexible heat pipe passing from the first device housing through a strap coupling the first device housing to a second device housing and into the second device housing. At 1811, the method comprises dissipating the thermal energy through the second device housing.

At 1812, the removal of the thermal energy of 1811 comprises transferring the thermal energy from heat generating electronics situated within the first device housing through a heat spreader to the flexible heat pipe. At 1813, the dissipation of the thermal energy at 1812 through the second device housing comprises delivering the thermal energy to another heat spreader situated within the second device housing. At 1814, the dissipation of the thermal energy through the second device housing of 1812 comprises delivering the thermal energy to a vapor chamber situated within the second device housing.

At 1815, a wearable electronic device comprises an anterior pendant comprising heat generating electronics situated therein. At 1815, the wearable electronic device comprises a posterior pendant comprising a heat spreader situated therein.

At 1815, a first neck strap couples a first side of the anterior pendant to a first side of the posterior pendant. At 1815, a second neck strap couples a second side of the anterior pendant to a second side of the posterior pendant. At 1815, a flexible heat pipe thermally coupled to the heat generating electronics and the heat spreader transfers thermal energy from the heat generating electronics to the heat spreader for dissipation through the posterior pendant.

At 1816, the wearable electronic device of 1815 further comprises another heat spreader situated within the anterior pendant. At 1816, the wearable electronic device comprises a thermal flange thermally coupling the flexible heat pipe to the heat generating electronics.

At 1817, the wearable electronic device of 1816 further comprises a printed circuit board situated within the anterior pendant and supporting the heat generating electronics. At 1817, the other heat spreader is physically separated from the printed circuit board.

At 1818, the wearable electronic device of 1815 further comprises a printed circuit board situated within the anterior pendant and supporting the heat generating electronics. At 1818, the wearable electronic device comprises a thermal flange thermally coupling the flexible heat pipe to the printed circuit board, wherein the thermal flange is bolted to the printed circuit board.

At 1819, the flexible heat pipe of 1815 passes only through the first neck strap. At 1820, the wearable electronic device of 1815 comprises a plurality of audio outputs. At 1820, the plurality of audio outputs consists of a left channel audio signal output situated at a first end of the posterior pendant, a right channel audio signal output situated at a second end of the posterior pendant separated from the first end of the posterior pendant by a posterior pendant body, and a single combined left channel and right channel audio signal output situated at a cranial edge of the anterior pendant.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims.

Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims. The disclosure is defined solely by the appended claims including any amendments made during the pendency of this application and all equivalents of those claims as issued.

What is claimed is:

1. A wearable electronic device, comprising:
    a first device housing coupled to a second device housing by at least one strap;
    heat generating electronics situated within the first device housing;
    a heat pipe thermally coupled to the heat generating electronics, the heat pipe transferring thermal energy from the heat generating electronics through the at least one strap to the second device housing; and
    other heat generating electronics situated within the second device housing;
    wherein the heat generating electronics situated within the first device housing generate more heat than the other heat generating electronics.

2. The wearable electronic device of claim 1, further comprising a heat spreader situated within the first device housing and a thermal flange thermally coupling the heat pipe to the heat generating electronics situated within the first device housing.

3. The wearable electronic device of claim 1, further comprising:
    a heat spreader situated within the second device housing, the heat spreader dissipating the thermal energy transferred by the heat pipe through the at least one strap through the second device housing; and
    a thermal flange thermally coupling the heat spreader to the heat pipe.

4. The wearable electronic device of claim 3, further comprising:
    a printed circuit board supporting the heat generating electronics; and
    another thermal flange thermally coupling the heat pipe to the printed circuit board.

5. The wearable electronic device of claim 4, further comprising a thermal interface material positioned between one or both of the thermal flange and the printed circuit board and/or the another thermal flange and the heat spreader.

6. The wearable electronic device of claim 4, wherein the heat spreader comprises a vapor chamber.

7. The wearable electronic device of claim 3, further comprising:
a printed circuit board supporting the heat generating electronics; and
another heat spreader situated in the first device housing and thermally coupling the heat pipe to the heat generating electronics.

8. The wearable electronic device of claim 7, wherein the printed circuit board and the heat spreader are physically separated.

9. The wearable electronic device of claim 1, wherein:
the first device housing comprises an anterior pendant;
the second device housing comprises a posterior pendant;
the at least one strap comprises a first neck strap coupling a first side of the anterior pendant to a first side of the posterior pendant and a second neck strap coupling a second side of the anterior pendant to a second side of the posterior pendant; and
the heat pipe comprises a flexible heat pipe passing through the first neck strap.

10. The wearable electronic device of claim 9, wherein the second neck strap comprises a first second neck strap portion and a second second neck strap portion, further comprising a coupler to attach the first second neck strap portion and the second second neck strap portion together.

11. A method of cooling a wearable electronic device, the method comprising:
removing thermal energy from a first device housing of the wearable electronic device;
transferring the thermal energy through a flexible heat pipe passing from the first device housing, through a strap coupling the first device housing to a second device housing, and into the second device housing; and
dissipating the thermal energy through the second device housing;
wherein the dissipating the thermal energy through the second device housing comprises delivering the thermal energy to another heat spreader situated within the second device housing.

12. The method of claim 11, wherein the removing the thermal energy comprises transferring the thermal energy from heat generating electronics situated within the first device housing through a heat spreader to the flexible heat pipe.

13. The method of claim 11, wherein the another heat spreader situated within the second device housing comprises a thermally conductive metal.

14. The method of claim 11, wherein the another heat spreader comprises a vapor chamber.

15. A wearable electronic device, comprising:
an anterior pendant comprising heat generating electronics situated therein;
a posterior pendant comprising a heat spreader situated therein;
a first neck strap coupling a first side of the anterior pendant to a first side of the posterior pendant;
a second neck strap coupling a second side of the anterior pendant to a second side of the posterior pendant; and
a flexible heat pipe thermally coupled to the heat generating electronics and the heat spreader, the flexible heat pipe transferring thermal energy from the heat generating electronics to the heat spreader for dissipation through the posterior pendant.

16. The wearable electronic device of claim 15, further comprising another heat spreader situated within the anterior pendant and a thermal flange thermally coupling the flexible heat pipe to the heat generating electronics.

17. The wearable electronic device of claim 16, further comprising a printed circuit board situated within the anterior pendant and supporting the heat generating electronics, wherein the another heat spreader is physically separated from the printed circuit board.

18. The wearable electronic device of claim 15, further comprising a printed circuit board situated within the anterior pendant and supporting the heat generating electronics and a thermal flange thermally coupling the flexible heat pipe to the printed circuit board, wherein the thermal flange is bolted to the printed circuit board.

19. The wearable electronic device of claim 15, wherein the flexible heat pipe passes only through the first neck strap.

20. The wearable electronic device of claim 15, wherein the wearable electronic device comprises a plurality of audio outputs, the plurality of audio outputs consisting of:
a left channel audio signal output situated at a first end of the posterior pendant;
a right channel audio signal output situated at a second end of the posterior pendant separated from the first end of the posterior pendant by a posterior pendant body; and
a single combined left channel and right channel audio signal output situated at a cranial edge of the anterior pendant.

* * * * *